(12) United States Patent
Daubenspeck et al.

(10) Patent No.: US 8,492,267 B1
(45) Date of Patent: Jul. 23, 2013

(54) PILLAR INTERCONNECT CHIP TO PACKAGE AND GLOBAL WIRING STRUCTURE

(71) Applicant: International Business Machines Corporation, Armonk, NY (US)

(72) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/633,449

(22) Filed: Oct. 2, 2012

(51) Int. Cl.
*H01L 21/4763* (2006.01)

(52) U.S. Cl.
USPC .......................................... 438/622; 438/638

(58) Field of Classification Search
USPC ........................................................ 438/641
See application file for complete search history.

(56) References Cited

U.S. PATENT DOCUMENTS

| | | | |
|---|---|---|---|
| 4,721,689 A | 1/1988 | Chaloux, Jr. et al. |
| 4,997,746 A | 3/1991 | Greco et al. |
| 6,133,635 A | 10/2000 | Bothra et al. |
| 6,147,394 A | 11/2000 | Bruce et al. |
| 7,884,007 B2 | 2/2011 | Chia et al. |
| 7,939,445 B1 | 5/2011 | Sutardja et al. |
| 7,951,709 B2 | 5/2011 | Pratt |
| 8,058,735 B2 | 11/2011 | Lee et al. |
| 8,110,926 B2 | 2/2012 | Grygiel |
| 2007/0111499 A1 | 5/2007 | Lo |
| 2007/0284726 A1 | 12/2007 | Lin et al. |
| 2009/0008133 A1 | 1/2009 | Bullard et al. |

*Primary Examiner* — Cheung Lee
(74) *Attorney, Agent, or Firm* — David A. Cain; Roberts Mlotkowski Safran & Cole, P.C.

(57) ABSTRACT

Pillar interconnect chip to package and global wiring structures and methods of manufacturing are discloses. The method includes forming a resist directly over at least one landing pad and at least one wiring layer, and forming a first pattern in the resist over the landing pad and a second pattern over the wiring layer, using a single lithography step. The method further includes forming metal in the first pattern in electrical contact with the landing pad. The method further includes removing remaining resist over the wiring layer to deepen the second pattern. The method further includes forming a pillar interconnect in the first pattern and a wiring in the second pattern by adding additional metal on the metal in the first pattern and over the at least one wiring layer in the second pattern, respectively. The method further includes removing any remaining resist.

20 Claims, 7 Drawing Sheets

US 8,492,267 B1

PILLAR INTERCONNECT CHIP TO PACKAGE AND GLOBAL WIRING STRUCTURE

FIELD OF THE INVENTION

The invention relates to semiconductor structures and, more particularly, to pillar interconnect chip to package and global wiring structures and methods of manufacturing.

BACKGROUND

Flip chip technology (also known as controlled collapse chip connection (C4)) is a method for interconnecting semiconductor devices to external circuitry with solder bumps that have been deposited onto chip pads. The solder bumps are deposited on the chip pads via an interconnect structure, during the final wafer processing step. In order to mount the chip to external circuitry (e.g., a circuit board or wafer), it is flipped over so that its top side faces down, and aligned so that its pads align with matching pads on the external circuitry. After such alignment is accomplished, the solder is flowed to complete the interconnect. This is in contrast to wire bonding, in which the chip is mounted upright and wires are used to interconnect the chip pads to external circuitry.

In flip chip interconnect technologies, the interconnect is typically formed in discrete steps from the global wiring structures. That is, the interconnect is formed in one set of processing steps; whereas, the global wiring structures such as, wires, inductors, etc., are formed in a different set of processing steps. This, in turn, requires additional masks. This, of course, increases manufacturing costs. Also, a reduction of critical device dimensions reduces required chip area which creates need for interconnect pitch reduction. This drives higher power requirements per area. Also, lower cost solder systems can be limited in power density by electromigration limits, and to compensate for this effect by using other materials can increase manufacturing costs.

Accordingly, there exists a need in the art to overcome the deficiencies and limitations described hereinabove.

SUMMARY

In an aspect of the invention, a method comprises forming a resist directly over at least one landing pad and at least one wiring layer. The method further comprises forming a first pattern in the resist over the at least one landing pad and a second pattern in the resist over the at least one wiring layer, using a single lithography step. The method further comprises forming metal in the first pattern in electrical contact with the at least one landing pad. The method further comprises removing remaining resist over the at least one wiring layer to deepen the second pattern. The method further comprises forming a pillar interconnect in the first pattern and a wiring in the second pattern by adding additional metal on the metal in the first pattern and over the at least one wiring layer in the second pattern, respectively. The method further comprises removing any remaining resist.

In an aspect of the invention, a method comprises forming a resist over at least one landing pad and at least one wiring layer. The method further comprises, using a single lithography step, forming a first pattern of a first depth in the resist to expose the at least one landing pad; and a second pattern of a second depth in the resist. The second pattern blocks formation of metal on the at least one wiring layer. The method further comprises forming the metal in the first pattern to a height of at least half the depth of the first pattern. The metal is formed in electrical contact with the at least one landing pad. The method further comprises deepening the second pattern to expose the at least one wiring layer. The method further comprises adding additional metal in the first pattern to form a pillar interconnect, and adding the additional metal in the second pattern to form a wiring in electrical contact with the at least one wiring layer in the second pattern. The method further comprises removing any remaining resist.

In an aspect of the invention, a method comprises: forming a wiring layer and an landing pad on a substrate; forming a seed layer on the wiring layer and the landing pad; forming a resist over the landing pad and the wiring layer; in a single lithography step: forming a first pattern of a first depth in the resist to expose the seed layer on the at least one landing pad; and a second pattern of a second depth in the resist, the second depth is less than the first depth; forming metal in the first pattern directly on the seed layer; deepening the second pattern by one of laser ablation and etch back processes to expose the seed layer on the wiring layer; in a same deposition step: adding additional metal on the metal in the first pattern to form an interconnect structure; and adding the additional metal in the second pattern on the seed layer to form a wiring in electrical connection with the wiring layer; removing any remaining resist; and bonding a laminate to the interconnect structure by reflowing solder material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure, which comprises the structures of the present invention. In still further embodiments, a method in a computer-aided design system is provided for generating a functional design model of the semiconductor structure. The method comprises generating a functional representation of the structural elements of the semiconductor structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to pillar interconnect chip to package and global wiring structures and methods of manufacturing. More specifically, the present invention provides a global wiring level created with processes used for fabricating pillar interconnects between a chip and a respective laminated package. In embodiments, the method of fabricating the global wiring level includes the use of a mask with graduated transmission in order to selectively plate the global wiring level, e.g., global power distribution wirings, inductors, etc., during subsequent plating processes. In embodiments, the selectively plating process will result in a global wiring level with reduced metal thickness, compared to the pillar interconnects. Advantageously, the present invention provides reduced processing steps and enables cost reduction by using a single mask for fabrication of both the pillar interconnect and the global wiring level.

Figure 1:
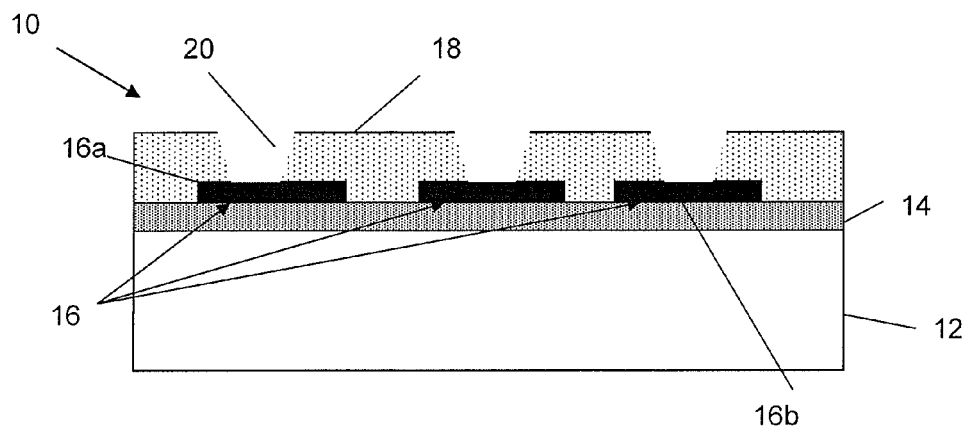
FIGS. 1-9b show structures and respective processing steps in accordance with aspects of the present invention.

FIG. 1 shows fabrication processes and a respective structure in accordance with aspects of the present invention. More specifically, the structure 10 of FIG. 1 is a back end of the line (BEOL) structure with a last wiring layer. In particular, the structure 10 includes a wafer or substrate 12. In embodiments, the substrate 12 can include any semiconductor material such as, for example, silicon, SiGe, etc. A number of wiring layers 14 are formed on the substrate 12 using conventional deposition, lithography and etching processes known to those of skill in the art such that further explanation is not required herein. It should be understood by those of skill in the art that one or more wiring layers are represented by reference numeral 14, each of which can include, for example, metal wirings and interconnects formed in interlevel dielectric material, e.g., oxide.

Still referring to FIG. 1, a last wiring layer 16 is formed on the one or more wiring layers 14. In embodiments, the last wiring layer 16 can include a landing pad 16a for an I/O and a wiring 16b, both on a same level. The last wiring layer 16 can be formed by either an additive or subtractive process. For example, in a subtractive process, a metal or metal alloy, e.g., aluminum or copper, can be deposited on an upper surface of the one or more wiring layers 14 using conventional deposition processes, e.g., chemical vapor deposition (CVD). A resist material can then be formed on the metal or metal alloy, and exposed to light to form a pattern (openings). An etching process, e.g., reactive ion etching (RIE), is performed to pattern the metal or metal alloy to form the last wiring layer 16 (e.g., I/O landing pads 16a and wiring 16b). The resist material can then be removed using conventional oxygen ashing processes.

A passivation layer 18 is formed over the last wiring layer 16 and any exposed surfaces of the one or more wiring layers 14. In embodiments, the passivation layer 18 can be an oxide material, formed by deposition processes. For example, the oxide material can be deposited using a CVD process. In embodiments, openings 20 are formed in the passivation layer 18, exposing a surface of each of the last wiring layer 16 (e.g., I/O landing pads 16a and wirings 16b). The openings 20 can be formed using conventional lithography and etching processes, as already described herein.

Figure 2:
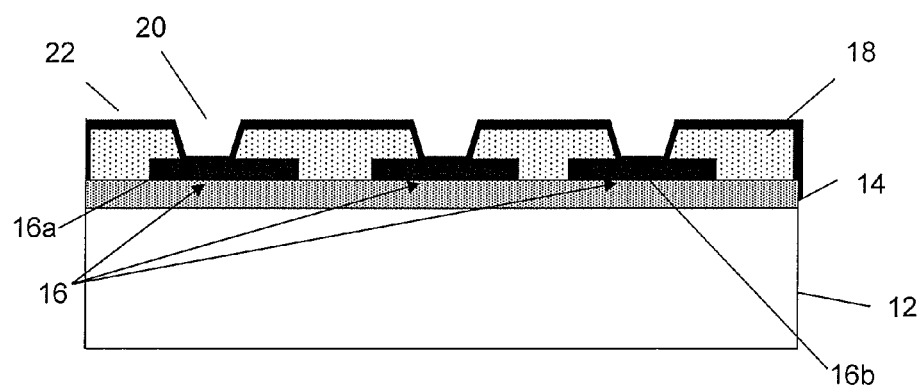

Referring now to FIG. 2, a seed layer 22 is formed on the exposed surfaces of the passivation layer 18, including within the openings 20 and on exposed surfaces of the last wiring layer 16 (including the I/O landing pads 16a and wirings 16b). The seed layer 22 can be a copper seed layer, formed by conventional CVD processes.

Figure 3:
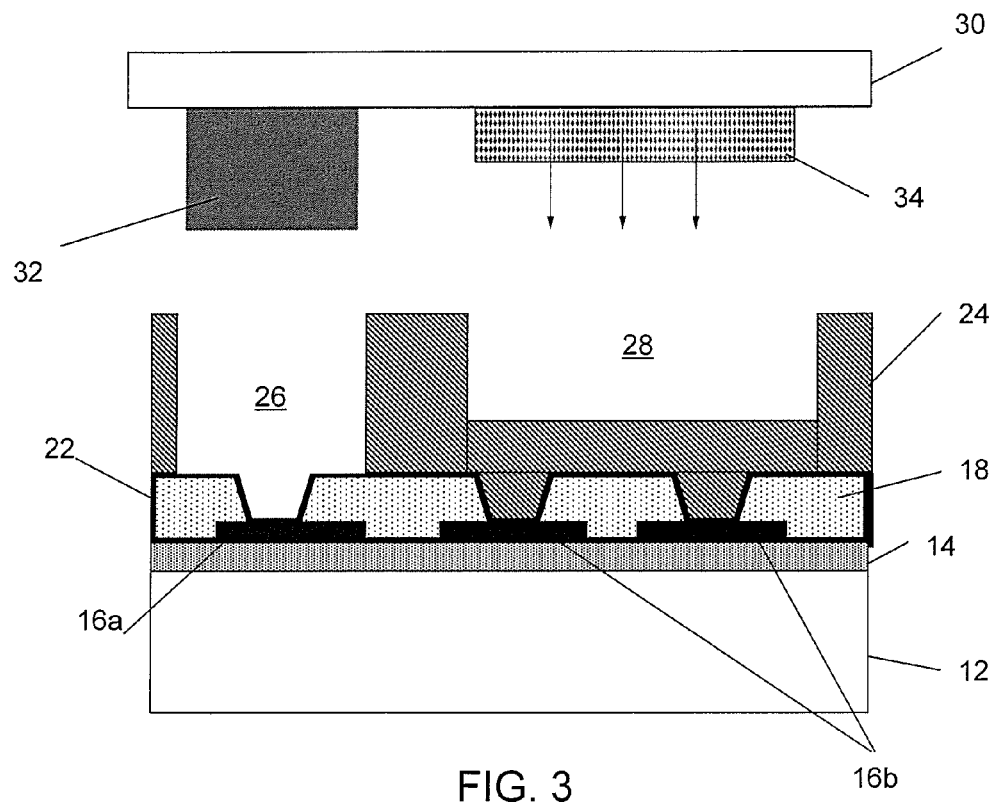

In FIG. 3, a resist 24 is formed over the seed layer 22 and patterned to form patterns 26 and 28. In embodiments, the resist 24 is a negative resist. In embodiments, the pattern 26 is an opening that exposes the underlying I/O landing pad 16a and seed layer 22; whereas, the pattern 28 is a trench, e.g., a partial opening which does not expose the underlying last wiring 16b.

The patterns 26, 28 are of different depths, which is formed by using a single mask 30 which has different transmissivity levels. More specifically, in order to form the different patterns 26, 28, e.g., patterns of different depths, a single lithography step utilizes the mask 30 which has a first transmissivity region 32 and a second transmissivity region 34. For example, in embodiments, the first transmissivity region 32 allows about 0% transmission of light through the mask 30, e.g., completely blocks the light; whereas, the second transmissivity region 34 allows about 40% transmission of light through the mask 30. In this way, the negative resist 24 can be completely removed under the first transmissivity region 32 and partially removed under the second transmissivity region 34.

It should be understood by those of skill in the art that the above noted transmissivity levels of the first transmissivity region 32 and second transmissivity region 34 are only illustrative examples, and that other transmissivity levels are contemplated by the present invention, in order to provide the different patterns 26, 28. For example, the transmissivity level of the second transmissivity region 34 can be adjusted to remove more or less of the resist 24 to form different depths over the wiring 16b, within the scope of the present invention. By way of illustrative, non-limiting example, the transmissivity level of the second transmissivity region 34 can be about 30%.

Figure 4:
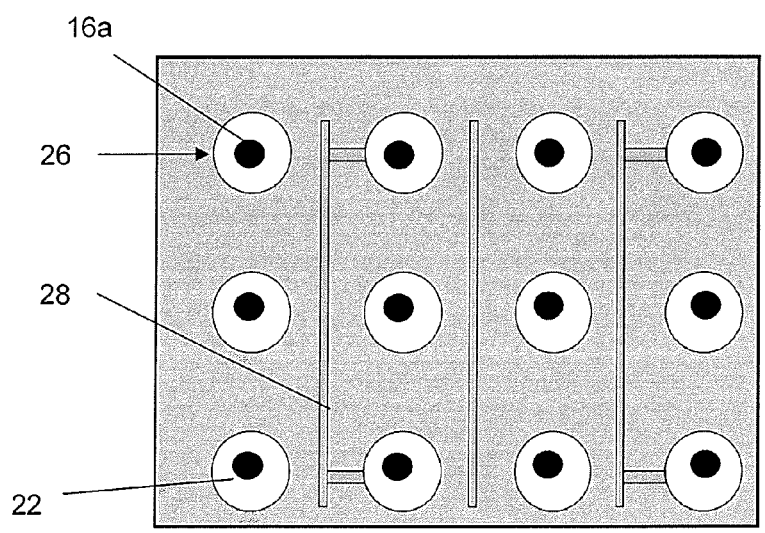

FIG. 4 shows a top view of the structure of FIG. 3. As shown in FIG. 4, the patterns 26 are circular in cross section, and are of such a depth as to expose the underlying I/O landing pads 16a and seed layer 22. In embodiments, the pattern 26 is about 85 microns in diameter and about 50 microns in depth; although other dimensions are also contemplated by the present invention. (The underlying I/O landing pads 16a can, in embodiments, refer to both the seed layer 22 and underlying metal.) The pattern 28, on the other hand, are shaped as wiring lines and do not reach to or expose the underlying last wiring layer (last wiring layer 16b shown in FIG. 3) or seed layer 22, e.g., the pattern 28 have a depth less than that of the pattern 26.

Figure 5:
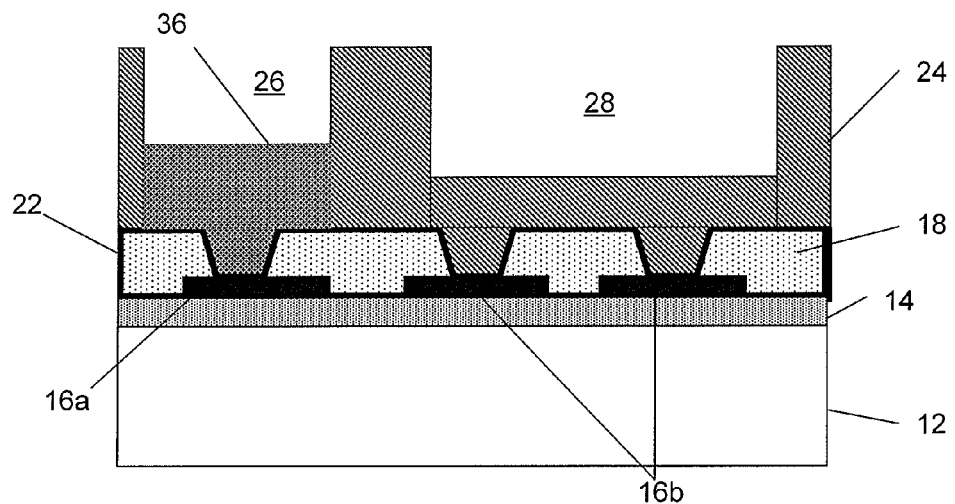

In FIG. 5, the pattern (opening) 26 is partially filled with metal 36. In embodiments, the metal 36 is copper, and is formed within the pattern 26 by an electroplating process. As should be understood by those of ordinary skill in the art, the electroplating process will form copper on only the seed layer 22, within the pattern 26. As should further be understood by those of ordinary skill in the art, the resist 24 over the wiring layer 16b will block formation of the metal on the wiring layer 16b. In embodiments, the metal 36 partially fills the pattern 26, preferably about one half (½) or more of the depth of the pattern 26, e.g., 25 microns or more. The metal 36 is now in electrical contact with the I/O landing pad 16a.

Figure 6:
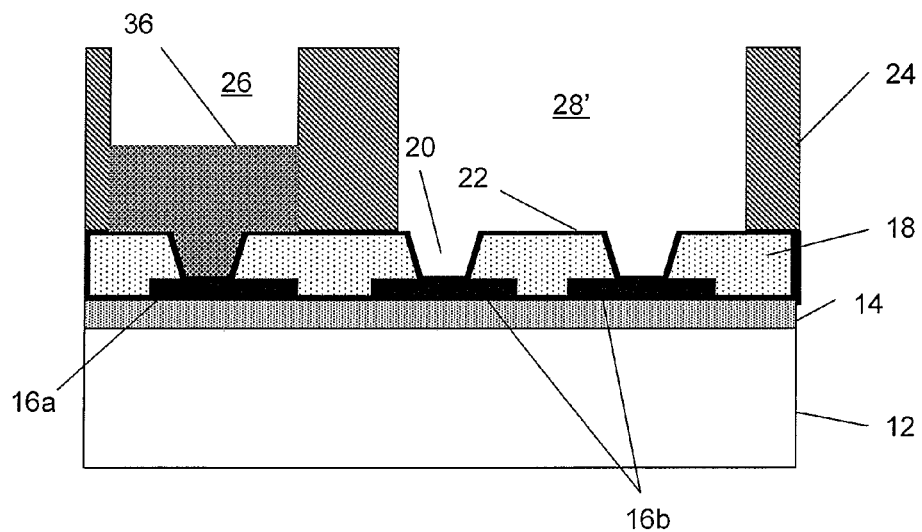

In FIG. 6, the remaining portion of the resist 24 is removed within the pattern (trench 28) over the wiring 16b, forming an opening 28'. The opening 28' exposes the underlying wiring 16b and seed layer 22. In embodiments, the remaining portion of the resist 24 can be removed using, for example, an etch back process. For example, the etch back process can be an $O_2$ plasma with a brief dilute HF to remove any copper oxidation. This process will also remove an upper layer of the resist 24, e.g., about 10 microns, but should not remove any significant portion of the metal (e.g., copper) 36 within the pattern 26. An alternative method of removing the resist within the pattern (trench 28) over the wiring 16b includes a directional laser ablation process, known to those of skill in the art.

Figure 7:
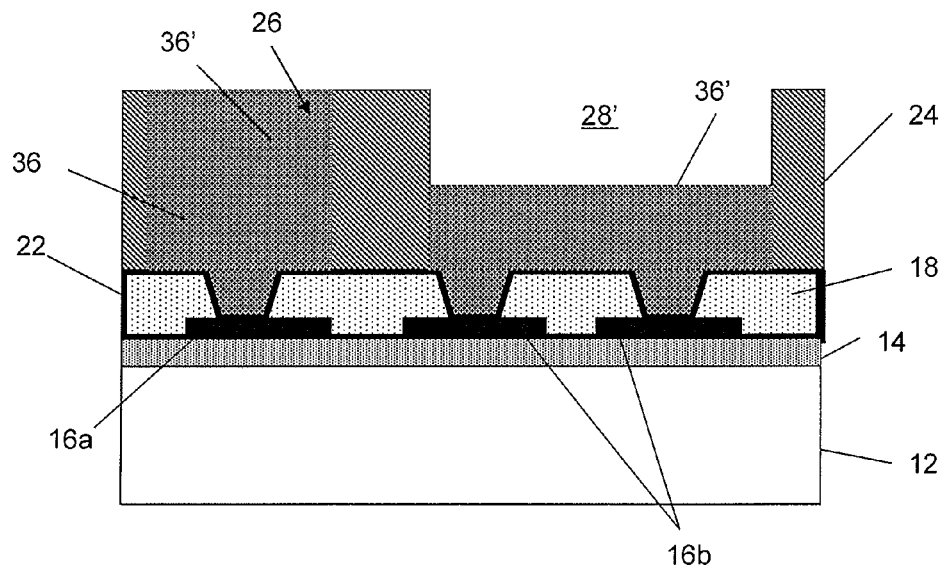

In FIG. 7, the pattern (opening) 28' is partially filled with metal 36'. In embodiments, the metal 36' is copper, and is formed within the pattern 28' by an electroplating process. The metal 36' will be in electrical contact with the wiring 16b. As should be understood by those of ordinary skill in the art, the electroplating process will form copper on the seed layer 22, within the pattern 28', in addition to forming additional copper 36' within the pattern 26 (in a same deposition process). In embodiments, the metal 36' is formed to a thickness of about 10 microns within the pattern 28'. Also, the electroplating process will increase the thickness of the metal within the pattern 26 to about 40 microns. It should be understood by those of skill in the art that other dimensions are contemplated by the present invention. For example, the thickness of the metal 36' within the pattern 28' can be about one half (½) the height (thickness) of the metal within the pattern 26, in order to avoid warpage during package bonding.

Figure 8:
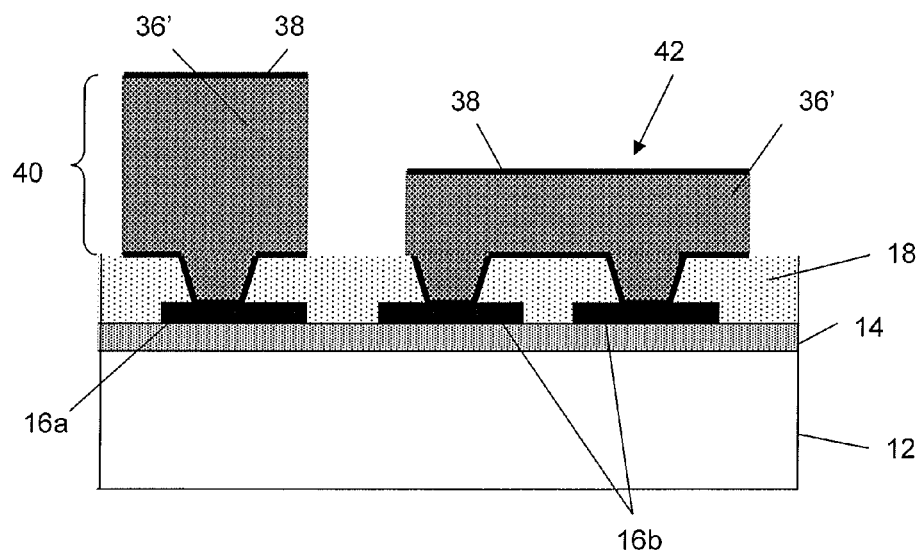

In FIG. 8, the exposed surfaces of the metal 36 can be treated by a flash application or a brief deposition process, preferential to the metal 36'. In embodiments, this surface treatment forms a thin layer of metal 38, e.g., gold, on the metal 36'. In embodiments, the thin layer of metal 38 is about 200 Å, in thickness. In this way, a copper pillar or interconnect 40 and a wiring layer 42 are formed, using a single masking process. In embodiments, the wiring layer is representative of a global wiring level, e.g., global power distribution wirings, inductors, etc. The remaining resist is removed by, for example, an etch back process, e.g., an $O_2$ plasma with a brief dilute HF or, alternatively, by a directional laser ablation process. In this process, exposed portions of the seed layer can also be removed.

Figure 9A:
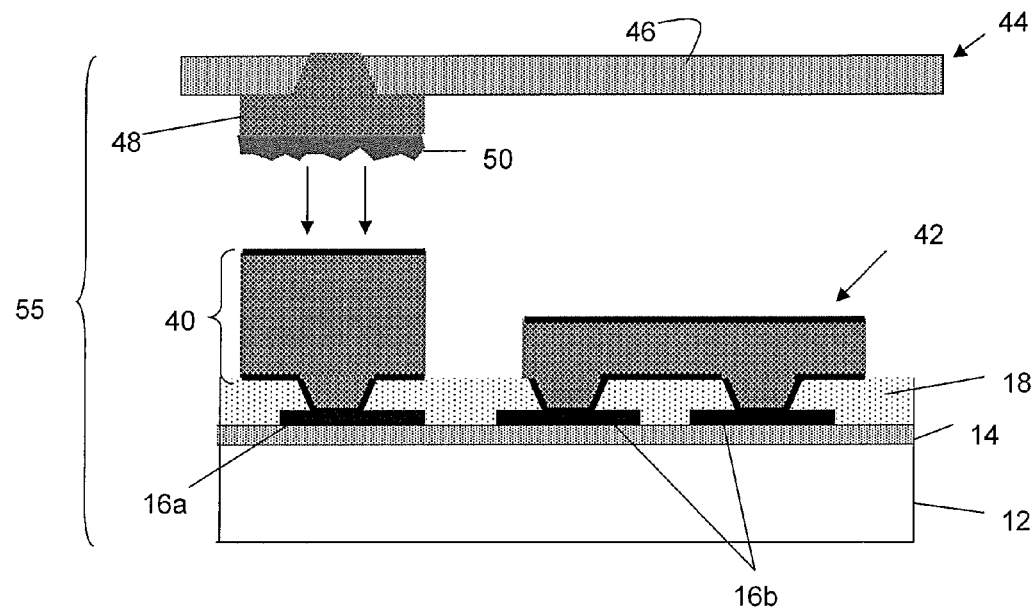
Figure 9B:
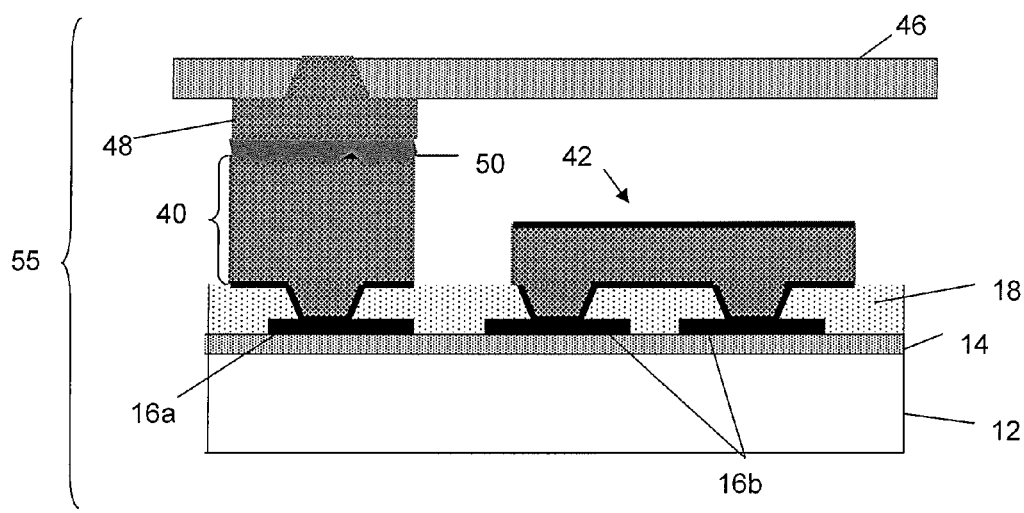

Referring to FIGS. 9a and 9b, a package 55 is formed by bonding a laminate 44 to the copper pillar or interconnect 40. In embodiments, the laminate 44 includes a passivation layer 46 having a pad structure and metal layer, represented by reference numeral 48. The pad structure and metal layer 48 can extend to and make contact with other components (not shown). A solder material 50 is provided on the surface of the pad structure and metal layer 48. The pad structure and metal layer 48 is joined to the copper pillar or interconnect 40 by a reflow process to permanently bond them together to form the package 55.

Figure 10A:
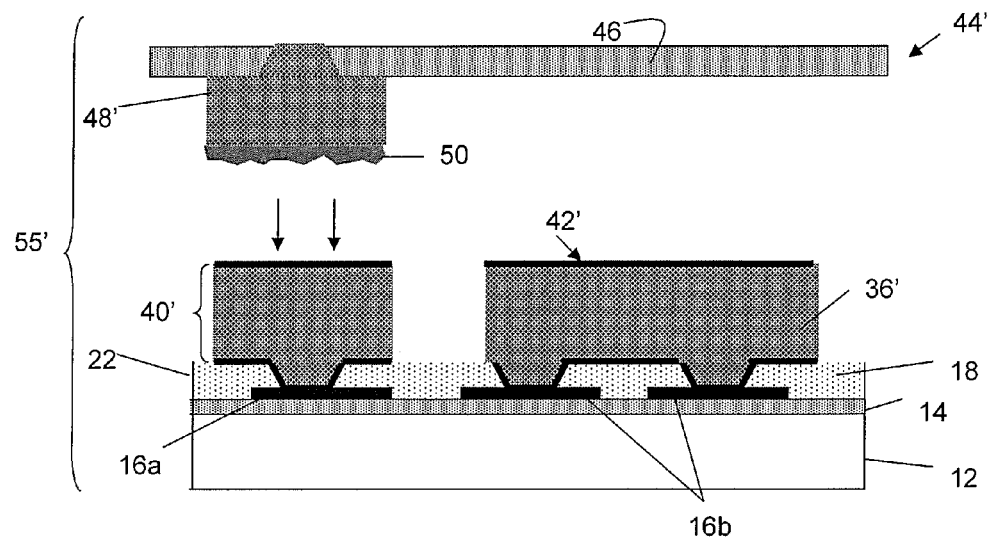
FIGS. 10a-10b show structures and respective processing steps in accordance with additional aspects of the present invention.
Figure 10B:
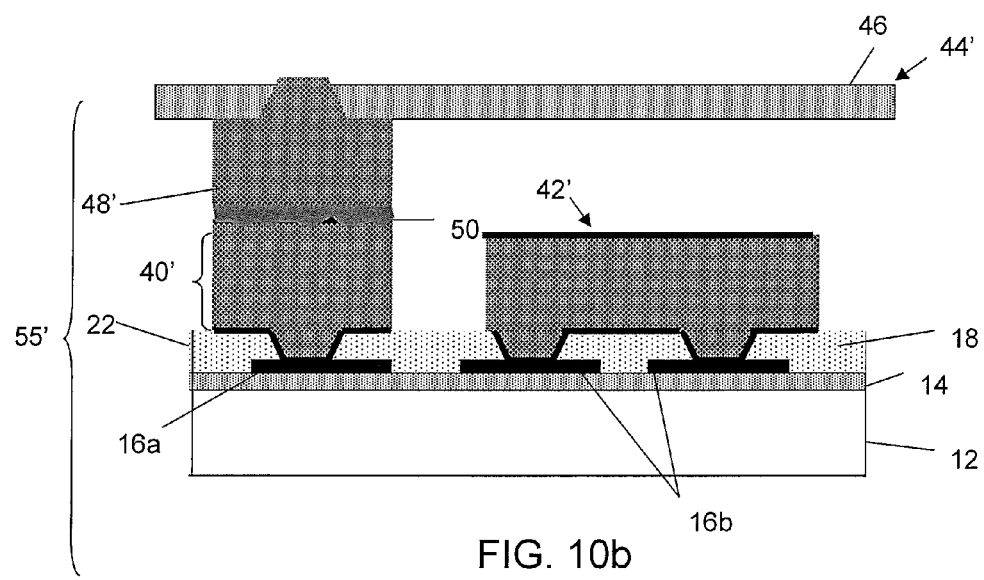

FIGS. 10a-10b show structures and respective processing steps in accordance with additional aspects of the present invention. In FIGS. 10a and 10b, the structure 10' includes a copper pillar or interconnect 40', similar to that described and formed with reference to FIGS. 1-9b. The structure 10' also includes a wiring 42', in contact with the wiring 16b. In embodiments, the wiring layer 42' is representative of a global wiring level, e.g., global power distribution wirings, inductors, etc., and is of the same or substantially the same height (thickness) as the copper pillar or interconnect 40'. In this embodiment, the wiring layer 42' can be formed in the same processes as the copper pillar or interconnect 40' by using a mask having the same transmissivity for both the first transmissivity region 32 and the second transmissivity region 34.

As further shown in FIGS. 10a and 10b, the package 55' is formed by bonding a laminate 44' to the copper pillar or interconnect 40'. In embodiments, the laminate 44' includes a passivation layer 46 having a pad structure and metal layer, represented by reference numeral 48'. In this embodiment, the pad structure and metal layer 48' is a pillar structure, which is of sufficient height so as to provide clearance between the laminate 44' and wiring layer 42' during the bonding or reflow process. A solder material 50 is provided on the surface of the pillar structure 48'. The pad structure and metal layer 48' is joined to the copper pillar or interconnect 40' by a reflow process to permanently bond them together to form the package 55'.

Figure 11:
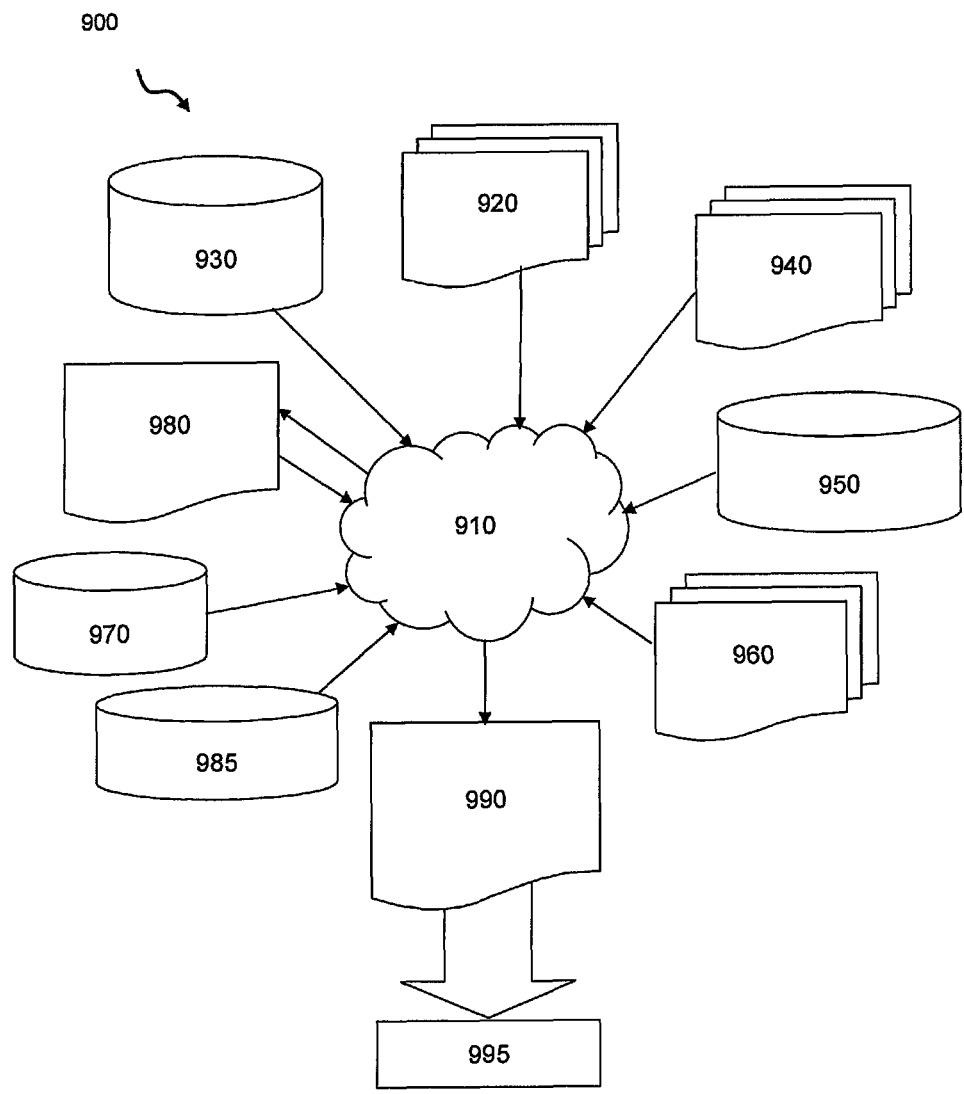
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9a, 9b, 10a and 10b. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 92Q may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9a, 9b, 10a and 10b. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9a, 9b, 10a and 10b to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9a, 9b, 10a and 10b. In one embodiment, design structure 990 may comprise a compiled, executable HDL simulation model that functionally simulates the devices shown in FIGS. 1-9a, 9b, 10a and 10b.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9a, 9b, 10a and 10b. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a resist directly over at least one landing pad and at least one wiring layer;
   forming a first pattern in the resist over the at least one landing pad and a second pattern in the resist over the at least one wiring layer, using a single lithography step;
   forming metal in the first pattern in electrical contact with the at least one landing pad;
   removing remaining resist over the at least one wiring layer to deepen the second pattern;
   forming a pillar interconnect in the first pattern and a wiring in the second pattern by adding additional metal on the metal in the first pattern and over the at least one wiring layer in the second pattern, respectively; and
   removing any remaining resist.

2. The method of claim 1, wherein the at least one landing pad and the at least one wiring layer are formed on a same wiring level by deposition of a metal layer.

3. The method of claim 1, further comprising forming a seed layer on the at least one landing pad and the at least one wiring layer, prior to forming the metal and adding the additional metal.

4. The method of claim 3, wherein the seed layer, the metal and the additional metal are copper.

5. The method of claim 1, wherein the forming the first pattern and the second pattern are formed with a single mask with different transmissivity regions.

6. The method of claim 5, wherein the different transmissivity regions comprise a first transmissivity region allowing about 0% transmission of light and a second transmissivity region allowing about 40% transmission of light.

7. The method of claim 1, wherein the removing the resist comprises one of an etch back process and laser ablation.

8. The method of claim 1, wherein:
the forming the first pattern and the second pattern are formed to different depths in the same lithography step;
the first pattern exposes the at least one landing pad; and
the second pattern blocks formation of the metal on the at least one wiring layer.

9. The method of claim 1, wherein the pillar interconnect and the wiring are formed at different heights.

10. The method of claim 1, wherein the pillar interconnect and the wiring are formed to a same height.

11. The method of claim 1, wherein the forming of the metal is formed to a height of at least one half the depth of the first pattern.

12. The method of claim 1, further comprising bonding a laminate to the pillar interconnect to form a package.

13. The method of claim 1, further comprising forming a surface treatment metal on the pillar interconnect and the wiring.

14. A method, comprising:
forming a resist over at least one landing pad and at least one wiring layer;
using a single lithography step:
   forming a first pattern of a first depth in the resist to expose the at least one landing pad; and
   a second pattern of a second depth in the resist, the second pattern blocks formation of metal on the at least one wiring layer;
forming the metal in the first pattern to a height of at least half the depth of the first pattern, the metal being formed in electrical contact with the at least one landing pad;
deepening the second pattern to expose the at least one wiring layer;
adding additional metal in the first pattern to form a pillar interconnect;
adding the additional metal in the second pattern to form a wiring in electrical contact with the at least one wiring layer in the second pattern; and
removing any remaining resist.

15. The method of claim 14, wherein the adding of additional metal in the first pattern and the second pattern are formed in a same deposition step.

16. The method of claim 14, further comprising forming a seed layer on the at least one landing pad and the at least one wiring layer, prior to forming the metal and adding the additional metal.

17. The method of claim 14, wherein the single lithography step includes using a single mask with different transmissivity regions such that a first transmissivity region blocks light over the at least one landing pad and a second transmissivity region allows a percentage of originating light to pass therethrough over the at least one wiring layer.

18. The method of claim 14, further comprising:
forming a surface treatment metal on the pillar interconnect and the wiring; and
bonding a laminate to the pillar interconnect to form a package, wherein:
   the removing the resist comprises one of an etch back process and laser ablation;
   the pillar interconnect and the wiring are formed at different heights; and
   the forming of the metal is formed to a height of at least one half the depth of the first pattern.

19. A method, comprising:
forming a wiring layer and an landing pad on a substrate;
forming a seed layer on the wiring layer and the landing pad;
forming a resist over the landing pad and the wiring layer;
in a single lithography step:
   forming a first pattern of a first depth in the resist to expose the seed layer on the at least one landing pad; and
   a second pattern of a second depth in the resist, the second depth is less than the first depth;
forming metal in the first pattern directly on the seed layer;
deepening the second pattern by one of laser ablation and etch back processes to expose the seed layer on the wiring layer;
in a same deposition step:
   adding additional metal on the metal in the first pattern to form an interconnect structure; and
   adding the additional metal in the second pattern on the seed layer to form a wiring in electrical connection with the wiring layer;
removing any remaining resist; and
bonding a laminate to the interconnect structure by reflowing solder material.

20. The method of claim 19, wherein the single lithography step includes using a single mask with different transmissivity regions such that a first transmissivity region blocks light over the at least one landing pad and a second transmissivity region allows a percentage of originating light to pass therethrough over the at least one wiring layer.

* * * * *